United States Patent [19]
Schmidt et al.

[11] Patent Number: 5,148,968
[45] Date of Patent: Sep. 22, 1992

[54] SOLDER BUMP STRETCH DEVICE

[75] Inventors: Detlef W. Schmidt, Schaumburg; Carl Mussele, Elgin; Kevin D. Moore, Schaumburg, all of Ill.

[73] Assignee: Motorola, Inc., Schaumburg, Ill.

[21] Appl. No.: 653,553

[22] Filed: Feb. 11, 1991

[51] Int. Cl.⁵ .............................. B23K 31/02
[52] U.S. Cl. ......................... 228/180.2; 228/19; 29/760; 29/840
[58] Field of Search .............. 228/19, 57, 180.2; 29/760, 840

[56] References Cited

U.S. PATENT DOCUMENTS 3,811,186  5/1974  Larnerd .
3,921,285  11/1975 Krall .................. 437/209 X
4,545,610  10/1985 Lakritz et al. ......... 228/180.2 X
4,878,611  11/1989 Lo Vasco et al. ....... 228/180.2

OTHER PUBLICATIONS

Koopman, N., "Solder Joining Technology," Mat. Res. Soc. Symp. Proc., vol. 154 (1989), pp. 431–440.
Coombe, V. D. and Larnerd, J. D., "Chip Support Assembly," IBM Technical Disclosure Bulletin, vol. 19, No. 4, pp. 1178–1179 (1976).

Primary Examiner—Richard K. Seidel
Assistant Examiner—Patty E. Hong
Attorney, Agent, or Firm—Douglas D. Fekete

[57] ABSTRACT

A solder bump stretch device is disclosed for use in mounting an electronic component to a substrate by a plurality of solder bump interconnections that are produced by reflowing preformed solder bumps carried on the component. the device is fastened to the component, which is in turn assembled with the substrate so that the bumps rest upon the substrate in preparation for solder reflow operations. The device comprises a flexible web that overlies the component outer face and is connected to legs that depend about the component. Prior to solder reflow, the web is held by an expendable spacer in a biased position wherein the legs are raised apart from the substrate. During heating to melt the solder bumps, the spacer is expended, releasing the web, whereupon the legs engage the substrte to lift the component relative to the substrate and thereby stretch the molten solder to form elongated interconnections preferably having hourglass configurations.

18 Claims, 2 Drawing Sheets

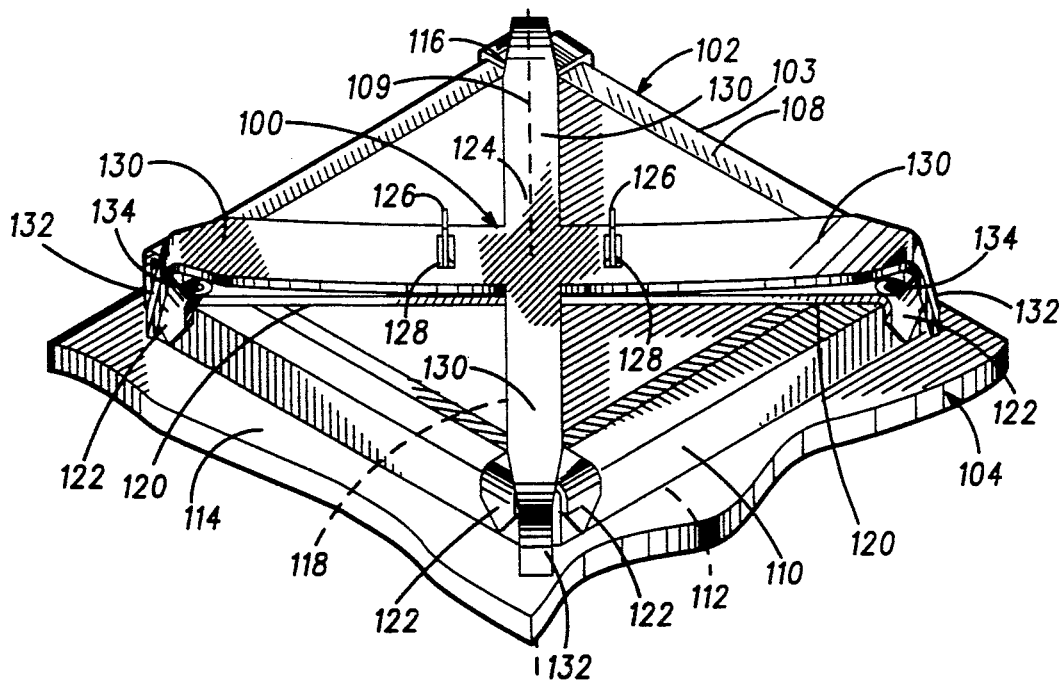
FIG.5
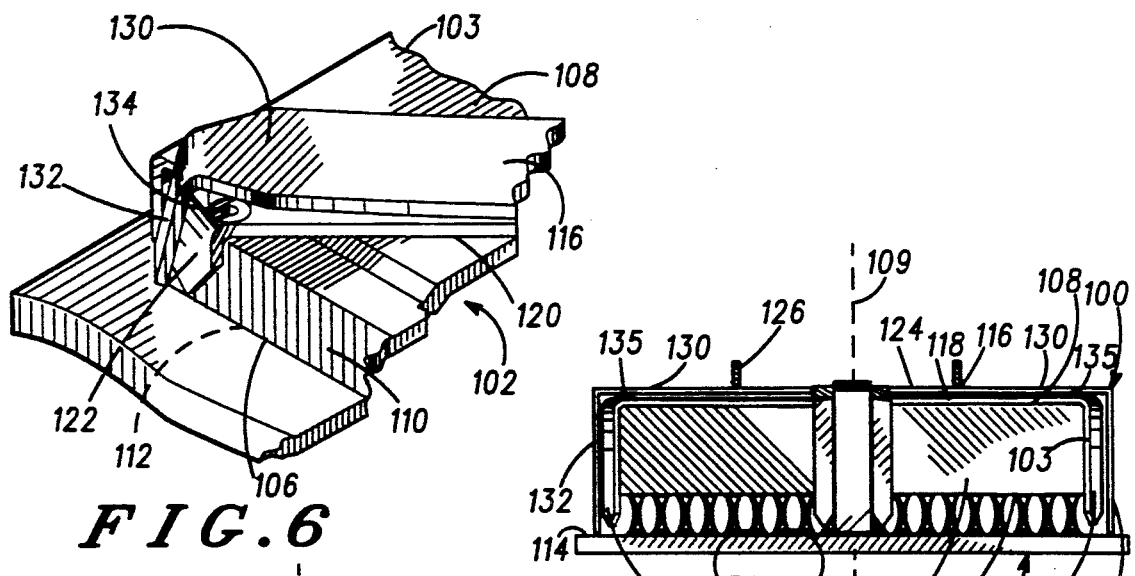
FIG.6
FIG.8
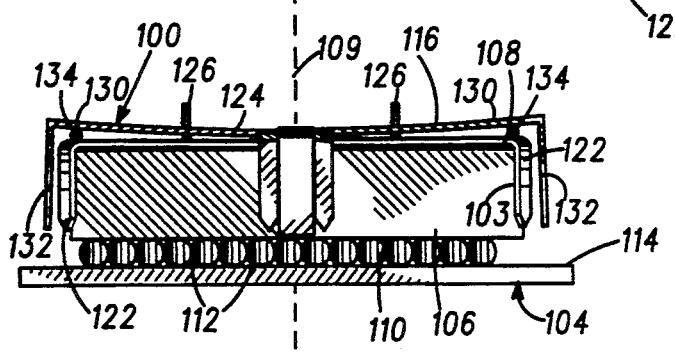
FIG.7

SOLDER BUMP STRETCH DEVICE

BACKGROUND OF THE INVENTION

This invention relates to a device for use in attaching an electronic component to a substrate by a plurality of solder bump interconnections formed by reflowing preformed solder bumps. More particularly, this invention relates to a device that is assembled with the component and the substrate in preparation for forming the interconnections and is actuated at an appropriate time during solder reflow operations to stretch the molten solder bumps and thereby form interconnections having a desired hourglass configuration.

A common electronic component package comprises a component, such as a pad array carrier, mounted onto substrate, such as a printed circuit board, by a plurality of solder bump interconnections. The component has a generally planar inner face comprising terminal bond pads formed of solder wettable metal and disposed in a array or other suitable pattern. A solder bump is applied to each bond pad, for example, by reflowing preformed microballs of the solder alloy. Alternately, the bumps may be applied by plating or vapor depositing the solder alloy. The substrate includes a generally planar component attachment region having terminal bond pads disposed in a corresponding pattern. In preparation for attachment, the component is superimposed on the substrate region such that each bump rests upon a corresponding pad on the substrate. The assembly is heated to reflow the solder alloy onto the substrate pad and, upon cooling, form the interconnection. The resulting package features the component with the inner face spaced apart from the substrate region by the solder bump interconnections. The interconnections physically bond the component to the substrate and also connect the terminal pads for conveying electrical signals to and from the component for processing.

Similar solder bump interconnections have been employed to attach an integrated circuit die to a pad array carrier or directly to a printed circuit board.

The component and the substrate are typically formed of different materials. During thermal cycling such as is normally experienced by the package during operation, the component and the substrate expand and contract, but at different rates. This thermal expansion mismatch generates stresses within the solder joints that may lead to failure of the interconnection. This problem is complicated by collapse of the solder bumps during reflow. When the bump is heated to melt the solder, the weight of the component collapses the molten droplet, resulting in an interconnection having a pancake configuration wherein the midsection is large relative to the bonding area at the terminal pads. This pancake configuration concentrates thermal stress fatigue at the solder bonds to the pads. It has been proposed to stretch the solder body during reflow to form elongated interconnections that reduce the concentration of stress at the pads and thereby extend the life of the interconnection. The elongated interconnections may exhibit a pillar or preferably an hourglass configuration. Before stretching the solder, it is necessary to first permit collapse of the molten bump to assure intimate contact with the pads that is essential to form the desired solder bonds. Also, the stretching distance needs to be controlled to avoid breaking contact with the pads. Furthermore, it is desired to elongate the interconnections within the soldering furnace, without additional steps that add to production costs.

SUMMARY OF THE INVENTION

This invention contemplates a solder bump stretch device for use in mounting an electronic component onto a substrate by a plurality of solder bump interconnections that are formed by reflowing preformed solder bumps carried initially on the component. The device is assembled with the component and the substrate prior to heating to melt and reflow the solder onto the substrate, and is actuated during solder reflow to lift the component relative to the substrate and thereby stretch the molten solder to form interconnections having hourglass configurations. The component comprises a generally planar inner face on which the preformed solder bumps are carried in an array or other suitable pattern and is arranged for mounting with the bumps resting upon a generally planar region of the substrate. The component also comprises a generally planar outer face opposite the inner face.

In accordance with a preferred embodiment, a solder bump stretch device of this invention comprises a flexible metal web that includes an anchor section. The device is fastened to the component such that the web overlies the component outer face and the web section is fixed to the outer face. Preferably, the web section is attached by clips or other means that permit the device to be removed following attachment of the component to the substrate. When fastened to the component, the web is flexible between a first, relaxed position wherein the web extends adjacent the component outer face, and a second, biased position wherein the web is bowed from the fixed section away from the outer face. The device further comprises legs dependent from the web and disposed about the component, preferably adjacent opposite sides thereof. Each leg is sized to engage the substrate when the web is in the relaxed position to establish a predetermined distance between the component inner face and the substrate region sufficient to stretch the molten solder bumps to form hourglass configurations.

The device of this invention further comprises at least one expendable spacer to bias the web in the biased position. In one aspect of this invention, the device comprises a rigid lift bar that extends above the fixed section and is operatively connected to the legs. The bar is moveable between a raised position and a lowered position. In the raised position, the bar is spaced apart from the fixed section, and the web is flexed to raise the legs relative to the substrate. In the lowered position, the bar lies adjacent the fixed section, with the web in the relaxed position, to lower the legs for engaging the substrate. The spacer is inserted between the bar and the web fixed section to support the web in the biased position in preparation for solder reflow operations. In another aspect of this invention, the web comprises flexible strips that are individually supported by a spacer wedged beneath each strip. In any event, the spacer is formed of a material that is expendable at solder reflow temperatures. For example, the spacer may be formed of a metal alloy, having a melting point slightly greater than the solder bumps, but within the range of the soldering furnace. Alternately, the spacer may be formed of a material that vaporizes at soldering temperature without residue.

For mounting the component to the substrate, the device is fastened with the component and assembled with the substrate with the component inner face facing the substrate and with the preformed solder bumps resting on the substrate. The device is held in a cocked condition by the expendable spacer. This assembly is then loaded into a furnace and heated to a temperature sufficient to melt the solder bump alloy for reflow onto the substrate. With the leg raised by the web held in the biased position by the spacer, the molten solder bumps are collapsed by the weight of the component and the device. This initial collapse assures intimate contact between the molten solder bump and the substrate which is essential to forming a strong solder bond. The assembly is further heated to expend the spacer, for example, by heating to a slightly higher temperature to melt a metal spacer. As a result, the web is released from the biased position and moves to the relaxed position. This causes the legs to engage the substrate, thereby lifting the component relative to the substrate. This lifting is accompanied by stretching the still-molten solder bumps to produce the desired elongated configuration. Upon cooling and resolidification of the solder bumps, a plurality of hourglass interconnections are formed bonding the component to the substrate.

Thus, this invention provides a self-contained mechanical device adapted to be assembled with a component for configuring the solder interconnections. The device is initially cocked with an expandable spacer in a manner that avoids interference with the initial collapse of the solder bumps to establish intimate contact between the molten solder alloy and the bonding surface. However, the device is triggered automatically during solder reflow to stretch the bumps a controlled length, determined by the length of the legs, effective to produce the desired elongated configuration without breaking contact with the bonding surface. This may be carried out conveniently within a conventional soldering furnace, utilizing a component and a substrate of conventional design, and without modification of the furnace or the heating cycle.

DESCRIPTION OF THE DRAWINGS

This invention will be further illustrated with reference to the following drawings:

FIG. 5 is a perspective view of an assembly of an alternate solder bump stretch device in accordance with this invention assembled with a component and a substrate;

FIG. 6 is a partial view of the assembly in FIG. 5 showing details thereof;

FIG. 7 is a side elevational view of the assembly in FIG. 5 showing the device thereof in a cocked condition; and FIG. 8 is a side elevational view of the assembly in FIG. 5, similar to the view in FIG. 7, and showing the assembly in lift condition.

DESCRIPTION OF A PREFERRED EMBODIMENT

Figure 1:
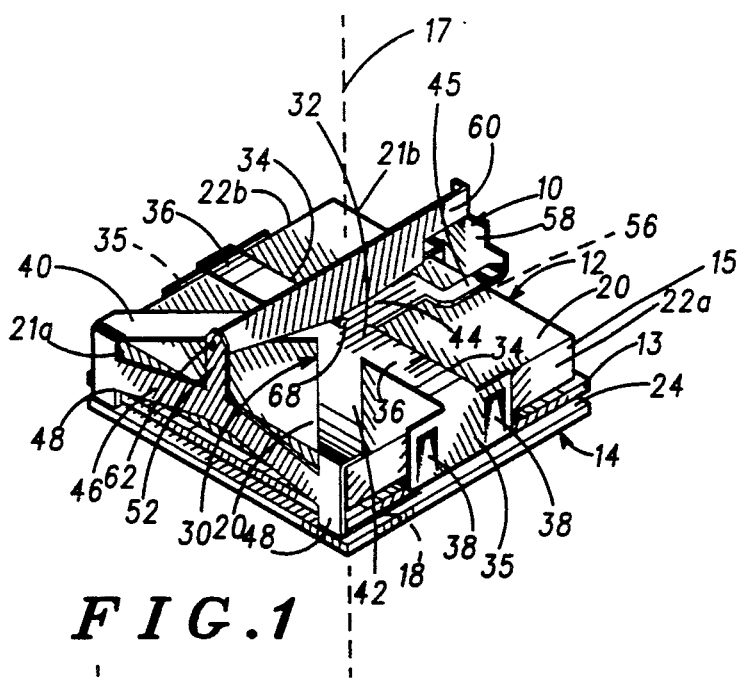
FIG. 1 is a perspective view of a solder bump stretch device in accordance with this invention assembled with a component and a substrate.
Figure 2:
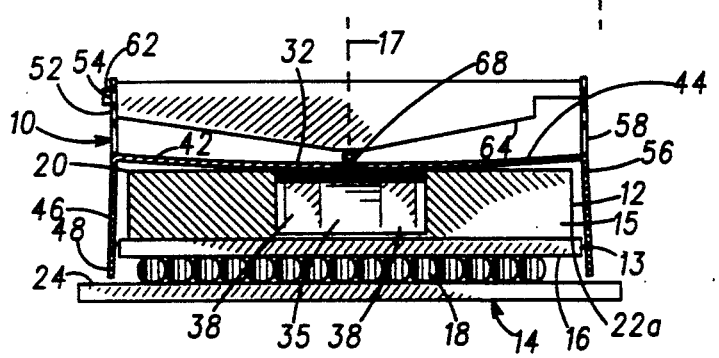
FIG. 2 is a side elevational view of the assembly in FIG. 1 showing the solder bump stretch device in a cocked condition.
Figure 3:
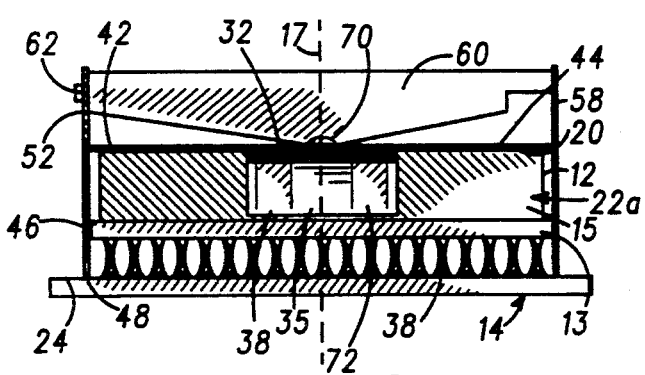
FIG. 3 is a side elevational view of the assembly in FIG. 1 similar to the view in FIG. 2, but showing the device in the solder stretch condition.

Referring to FIGS. 1 through 3, there is shown a solder bump stretch device 10 in accordance with a first preferred embodiment of this invention fastened to a component 12 for use in mounting the component to a substrate 14. In this example, component 12 is a pad array carrier that comprises an integrated circuit die mounted on a ceramic carrier 13 and protected by a cover 15. Component 12 comprises a square, generally planar inner face 16 that is perpendicular to an axis 17 and carries preformed solder bumps 18 arranged in a suitable array pattern and formed of an alloy composed of about 37 weight percent lead and the balance tin and having a melting point of about 183° C. Component 12 also includes a square, planar outer face 20 perpendicular to axis 17, a first pair of opposite axial sides 21a and 21b, and a second pair of opposite axial sides 22a and 22b. In this embodiment, substrate 14 is a printed circuit board that includes a generally planar region 24 also perpendicular to axis 17 and adapted for attachment of component 12. Device 10 is intended for use with a component 12 and a substrate 14 that are of conventional design and manufacture. Such conventional elements typically have surface features, in particular terminal bond pads for solder bonding to bumps 18, which are not shown to more clearly illustrate device 10.

Referring in particular to FIG. 1, device 10 comprises a flexible metal web 30 that overlies outer component face 20. Web 30 includes a central section 32 that is held against face 20 by clips 34. Clips 34 comprise pads 35 dependently connected to midsection 32 by flexible strips 36 that are sized in accordance to the specific dimensions of component face 20 to press fit pads 35 against sides 22a and 22b. Pads 35 include inwardly tilted tabs 38 that press against the adjacent sides to increase resistance to axial separation. Thus, clips 34 snugly attaches device 10 to component 12 with web section 32 held firmly against component face 20, but permit the device to be removed from the component following interconnection of the component onto substrate 14.

Web 30 further comprises flexible strips 40 and 42 that radiate from section 32 diagonally across component face 20 and extend beyond component side 21a. A flexible strip 44 extends from section 32 across component face 20 and includes a forked end portion 45 that protrudes beyond side 21b. Strips 40 and 42 are connected to opposite ends of an axial leg 46 that depends about component side 21a. Leg 46 includes spaced substrate-engagement feet 48 and an upward axial projection 52 that includes a slot 54. Strip 44 is connected to an axial leg 56 that extends downwardly about component side 21b and includes an upward projection 58. A rigid lift bar 60 extends edgewise from projection 58 and includes a tab 62 received in slot 54 of projection 52. Bar 60 includes an edge 64 immediately overlying web section 32.

Figure 4:
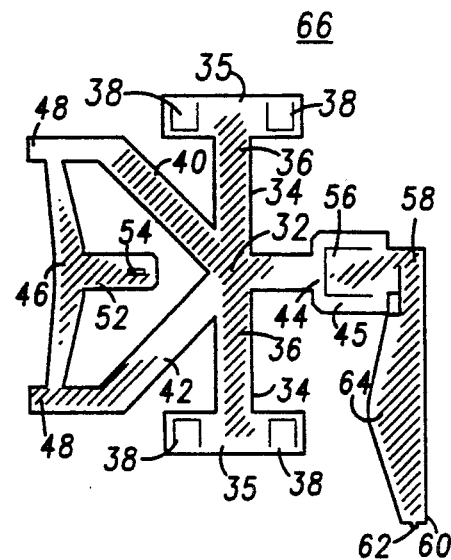
FIG. 4 is a plan view of a metal preform bendable to form the solder stretch device in FIG. 1.

A feature of device 10 is that the device is fashioned from an integral preform 66 shown in FIG. 4. Preform 66 is cut using a laser beam from a single metal sheet and bent to configure the device. Like numerals are indicated in FIG. 4 to identify portions of the preformed 66 corresponding to the elements of device 10.

Bar 60 is axially moveable between a raised position shown in FIGS. 1-2 wherein edge 64 is axially spaced from web section 32 and a lowered position shown in FIG. 3 wherein the edge lies adjacent the section. This bar movement is accommodated by flexing of strips 40, 42 and 44 in a spring-like manner between a relaxed position in FIGS. 1-2 wherein the strips extend adjacent component face 20 and a biased position in FIG. 3 wherein the strips are bowed from fixed section 32 away from component outer face 20 to raise legs 46 and 56 relative to substrate 14. Legs 46 and 56 are sized to engage substrate region 24 when the strips are in the relaxed position to establish a predetermined axial distance between component inner face 16 and region 24, but are raised by the strips in the biased position axially apart from the substrate. Thus, by raising and lowering bar 60, device 10 is moveable between a cocked condition in FIGS. 1-2 and a component lift condition in FIG. 3. In the cocked condition, bar 60 is raised to flex strips 40, 42 and 44 and raise legs 46 and 56, and is held by a spacer 68 inserted between bar edge 64 and web section 32. However, in the absence of the spacer bar, bar 60 is released and returns by the spring-like action of strips 40, 42 and 44 to the lowered position for lifting component 12 above substrate 14.

In preparation for mounting component 12 to substrate 14, device 10 is attached to component 12 by clips 34. Spacer 68 is formed of a cylindrical metal alloy bar composed of 3.5 weight percent silver and the balance tin and having a melting point of about 221° C. The spacer is inserted between bar edge 64 and web section 32 to cock device 10, as shown in FIGS. 1-2. The preassembly of the device 10 and component 12 is then positioned on substrate region 24 as shown in FIG. 2 with bumps 18 resting on corresponding metalized pads (now shown). The assembly is then loaded into a suitable infrared furnace and heated first to a temperature sufficient to melt the solder of bumps 18. Upon melting, bumps 18 collapse under the weight of component 12 and device of 10. This collapse creates intimate contact between the molten solder and the substrate bond pads. Thereafter, the assembly is further heated to melt spacer 68. As the spacer melts, the bias applied by strips 40, 42 and 44 urge edge 64 toward web section 32, cutting through the molten metal 70 in FIG. 3. As these strips straighten, the legs are lowered from the diverted position in FIG. 2 to engage substrate 14, as shown in FIG. 3. As a result, the component 12 is axially lifted relative to substrate 14. This lifting stretches the still-molten solder bumps, thereby producing an hourglass configuration as shown in FIG. 3. The length of legs 46 and 56 is sized to lift component interface 16 parallel to substrate region 24 and to stretch the solder bumps without loss of contact with either the component surface or the substrate region. Thereafter, the assembly is cooled to resolidify the solder alloy, thereby forming interconnections 72 having the desired hourglass configuration. Device 10 is then unclipped from the product electronic package. Device 10 may be cleaned to remove spacer solder residue for subsequent reuse.

Referring now to FIGS. 5-8, there is illustrated a solder bump stretch device 100 in accordance with an alternate embodiment of this invention. Device 100 is employed for mounting a component 102 to a substrate 104. Component 102 is similar to component 12 in FIGS. 1-3 and includes a housing 103 that laterally encloses an integrated circuit die carrier (not shown). Component 102 comprises a generally planar inner face 106 and a square, planar outer face 108 perpendicular to space axis 109, and also axial sides 110. Inner component face 106 carries a plurality of preformed tin/lead solder bumps 112. Component 102 is adapted to be mounted onto a generally planar region 114 of substrate 104.

In accordance with this embodiment, device 100 comprises superposed upper and lower X-shaped webs 116 and 118 overlying component outer face 108. The device is fastened to component 102 by the lower web 118, which comprises four clips 120 that extend diagonally across component face 108 and having dependent end pads 122. Clips 120 are sized corresponding the diagonal dimensions of face 108 to press fit pads 122 against the component side 110 at the corners. In this manner, device 100 is fastened to the component 102 during solder reflow operations, but may be removed following mounting of the component to the substrate so as not to form part of the product package.

Upper web 116 comprises a fixed central section 124 that is fastened to lower web 118 by upwardly projecting tabs 126 formed in the lower web and received in slots 128 formed in upper web 116. Web 116 further comprises four flexible strips 130 that extend from web section 124 and diagonally traverse component face 108 immediately above clips 120. Each strip 130 is connected to a dependent leg 132 that extends axially about component 102 at the corner of sides 110. Each strip 130 is flexible relative to the fixed midsection 124 between relaxed position shown in FIG. 7 wherein legs 132 engage substrate surface 114 to establish a predetermined distance between component inner face 106 and region 114, and a biased position shown in FIGS. 5-7 wherein the strip is bowed away from component face 108 to axially raise leg 132 apart from substrate region 114.

In preparation for attaching component 102 to substrate 104, device 100 is fastened to component 102 to overly upper face 108. Each strip 116 is independently flexed and held in the biased position by an expendable spacer 134 inserted between the strip and the underlying clip 120 of lower web 118, as shown in FIG. 6. Spacers 134 are formed of tin-base silver alloy having a melting point above bumps 112. In this manner, device 100 is placed in a cocked condition. Thereafter, component 102 with device 100 fastened thereto is positioned on substrate region 114 as shown in FIG. 7, with solder bumps 112 resting upon bond pads (not shown) of region 114. The assembly is then loaded into an infrared furnace and heated to a temperature sufficient to melt the solder alloy of bumps 112. Upon melting, the solder bumps collapse under the weight of component 102 and device 100. This collapse causes intimate contact between the substrate region 114 and the molten solder to assure suitable bonding. Thereafter, the assembly is further heated to melt spacers 134, forming a pool 135 in FIG. 8 of molten alloy and releasing strips 130 from the biased position for return to the relaxed position shown in FIG. 8. This release causes legs 132 to engage substrate surface 114. As a result, component 102 is lifted relative to substrate 104 to stretch the solder bumps and thereby produce bumps 136 having hourglass configurations as shown in FIG. 8. The device positions component inner face 106 parallel to and equidistant from substrate region 114. Thereafter, the assembly is cooled to resolidify the solder alloy to complete interconnections 136, whereafter device 100 is unfastened from component 102.

In contrast to device 10 in FIG. 1, device 100 is composed of two independently formed sheet metal elements 116 and 118 attached at midsection 124. The flexible strips 130 are independently biased by individual spacers. Referring to pads 122, the pads may be sized to extend below component inner face 106 to permit engagement of surface 114 in the event of an early release by the opposite strip that would otherwise tilt the component and cause a disproportionate collapse of the adjacent region. Component face 108 is conventionally formed of a material that is not solderable to the metal alloy of the spacer, thereby allowing the device to be unfastened and any spacer residue to be cleaned from the component. The elements 116 and 118 may be formed of sheet metal that is not solderable by the spacer alloy, thereby permitting residue to be removed for reuse of the device. Alternately, the device may be left on the component following attachment to the substrate as a protective overstructure.

In the described embodiments, the tin-base alloy of the spacer is a commercially available solder alloy, but was not used for soldering purposes. The alloy melted at a temperature greater than the bumps, but within the range of the soldering cycle, to delay actuation of the device until following collapse of the bumps. The device may be suitably actuated by a spacer formed of a metal or non-metal material that is expendable at the soldering furnace temperature. For example, the spacer may be formed of a solder alloy similar to solder bumps in which case actuation of the device may be delayed by bottom heating, for example, using a hot plate, to melt the bumps prior to the spacer. Alternately, spaces may be formed of a resinous material that vaporizes at soldering temperature without residue to eliminate post-solder cleaning.

Although in the described embodiments, the device was employed to form hourglass interconnections, such interconnections represent a preferred configuration. The device may be suitably adapted to form interconnections that, while not hourglass, are nevertheless elongated to reduce stress concentration at the bond pads. Thus, the device may be employed to lift the component a lesser distance to form elongated interconnections that are cylindrical or even buldged outward, but that nevertheless reduce the pancaking effect caused by collapse of the bumps during reflow.

While this invention has been described in terms of certain specific embodiments thereof, it will be appreciated that other forms could readily be adapted by those skilled in the art and, and accordingly, the scope of this invention is to be considered and limited only by the following claims.

The embodiments of the invention in which an exclusive property or privilege is claimed are defined as follows:

1. A solder bump stretch device for use in combination with an electronic component and a substrate in attaching the component to the substrate by reflowed solder interconnections, said component comprising an outer face opposite the substrate, said device being assembled with the component and the substrate and being actuated during solder reflow to life the component relative to the substrate to form elongated interconnections, said device comprising
    a web comprising a section and a flexible strip extending from the section,
    means for fastening the web to the component to fix the web section to the component outer face so that said strip overlies the component outer face and is flexible between a relaxed position wherein the strip extends adjacent the component outer face and a biased position wherein the strip is bowed apart from the component outer face,
    a leg connected to the strip remote from the section to depend about the component for engaging the substrate when the strip is in the relaxed position, and
    expendable spacer means for supporting the strip in the biased position, said means being expendable during solder reflow to release the strip to the relaxed position to engage the leg to the substrate to lift the component.

2. A solder bump stretch device in accordance with claim 1 wherein the web comprises at least two legs connected to the strip and disposed about the component.

3. A solder bump stretch device in accordance with claim 1 wherein the device fastening means comprises a clip for removably fastening the device to the component.

4. A solder bump stretch device in accordance with claim 1 wherein the expendable spacer means is formed of a metal meltable at solder reflow temperature.

5. A solder bump stretch device in accordance with claim 4 wherein the spacer means is formed of a metal having a melting point greater than the solder bumps.

6. A solder bump stretch device for use in combination with an electronic component and a substrate for attaching the component to the substrate by reflowed solder bump interconnections, said component comprising an outer face opposite the substrate, said device being actuated during solder reflow to lift the component relative to the substrate to thereby form interconnections having an elongated configuration, said device comprising
    a web comprising a web section and a flexible strip extending from the section,
    means for fastening the web to the component to fix the web section against the component outer face,
    a leg connected to the strip remote from the web section to depend about the component for engaging the substrate, and
    a lift bar operatively connected to the leg and having a section overlying the web section, said bar being moveable between a raised position wherein the bar section is spaced apart from the web section for receiving an expendable spacer therebetween and said strip is flexed to raise the leg relative to the substrate, and a lowered position wherein the strip extends adjacent the component outer face to lower the leg for engagement to the substrate.

7. A solder bump stretch device in accordance with claim 6 wherein the device fastening means comprises a clip for removably fastening the device to the component.

8. A solder bump stretch device in accordance with claim 6 wherein the device comprises at least two legs connected to the strip and disposed about the component for lifting the component parallel to the substrate.

9. A solder bump stretch device in accordance with claim 6 wherein all legs are operatively connected to a common lift bar and wherein the lift bar is supported by a singular spacer means for concurrently releasing the legs during solder reflow to engage the substrate.

10. A solder bump stretch device in accordance with claim 6 wherein the device is formed from a single metal preform.

11. A solder bump stretch device in accordance with claim 6, further comprising:

expendable spacer means intermediate the bar section and the web section for maintaining the bar in the raised position, said means being expendable at solder reflow temperature to release the bar to the lowered position.

12. A solder bump stretch device in accordance with claim 11 wherein the expendable spacer means is formed of a metal meltable at solder reflow temperature.

13. A solder bump stretch device for use in combination with an electronic component and a substrate for attaching the component to the substrate by reflowed solder bump interconnections, said component comprising an outer face opposite the substrate, said device being actuated during solder reflow to lift the component relative to the substrate and thereby from interconnections having an elongated configuration, said device comprising a web comprising a section and a flexible strip extending from the section and having end remote from the section, means for fastening the web to the component to fix the section to the component outer face such that the strip overlies the component outer face with the strip end extending about the component and is flexible between a relaxed position wherein the strip lies adjacent the component outer face and a biased position wherein the strip is bowed from the section to raise the end relative to the component outer face, a leg dependent from said strip end and sized to engage the substrate when the strip is in the relaxed position, and expendable spacer means for supporting the strip in the biased position, said means being expendable at solder reflow temperature to release the strip to the relaxed position to engage said leg to the substrate to lift the component and thereby to stretch the solder configurations.

14. A solder bump stretch device in accordance with claim 13 wherein the expendable spacer means is formed of a metal meltable at solder reflow temperature.

15. A solder bump stretch device in accordance with claim 13 wherein the expendable spacer means is formed of a metal having a melting point greater than the solder interconnections.

16. A solder bump stretch device in accordance with claim 13 wherein the expendable spacer means comprise a solder spacer wedged intermediate the strip and the component outer face to support the strip in the flexed position.

17. A solder bump stretch device in accordance with claim 13 further wherein the web comprises at least two flexible strips extending in opposite directions from the web section and having ends oppositely disposed about the component.

18. A solder bump stretch device in accordance with claim 17 wherein each strip is independently supported by the expendable spacer means.

* * * * *